United States Patent [19]
Arvanitis et al.

[11] 4,156,214
[45] May 22, 1979

[54] MULTIPOLE RESONATOR

[75] Inventors: Aristotelis S. Arvanitis, Addison; Stanley Malinowski, Park Ridge; Corwin E. Livenick, Hickory Hill, all of Ill.

[73] Assignee: Motorola, Inc., Schaumburg, Ill.

[21] Appl. No.: 759,517

[22] Filed: Jan. 14, 1977

[51] Int. Cl.² .............. H03H 9/04; H03H 9/26; H03H 9/32; H01L 41/22
[52] U.S. Cl. .................. 333/191; 29/25.35; 310/320; 310/366
[58] Field of Search ................. 333/72, 71; 310/320-333, 357, 358, 359; 29/25.35, 594

[56] References Cited

U.S. PATENT DOCUMENTS

| | | | |
|---|---|---|---|
| 3,487,318 | 12/1969 | Herman | 333/72 X |
| 3,582,836 | 6/1971 | Kent | 333/72 |
| 3,602,844 | 8/1971 | Sykes | 333/72 X |

FOREIGN PATENT DOCUMENTS 1948977  4/1971  Fed. Rep. of Germany ............. 333/72

OTHER PUBLICATIONS

Mason et al., "Physical Acoustics," vol. 1, Part A, Academic Press, New York and London, 1964; Title Page and pp. 365-367.

Primary Examiner—Alfred E. Smith
Assistant Examiner—Marvin Nussbaum
Attorney, Agent, or Firm—James W. Gillman; Victor Myer

[57] ABSTRACT

Three electrode pairs are formed on a monolithic piezoelectric element which exhibits anisotropic properties with respect to its X and Z axes. The electrodes of each pair are located on opposite sides of the piezoelectric element, with all electrodes being of predetermined dimensions. The first and second electrode pairs are aligned on the X axes at a predetermined spacing therebetween. The second and third electrode pair are aligned on the Z axis, also at a predetermined spacing.

In circuit operation, a signal to be processed is coupled to the first electrode pair and extracted from the third electrode pair, with the electrodes of the second pair shorted together. In this manner, the resonator displays a three pole passband characteristic having excellent spur suppression.

4 Claims, 6 Drawing Figures

U.S. Patent  May 22, 1979  4,156,214
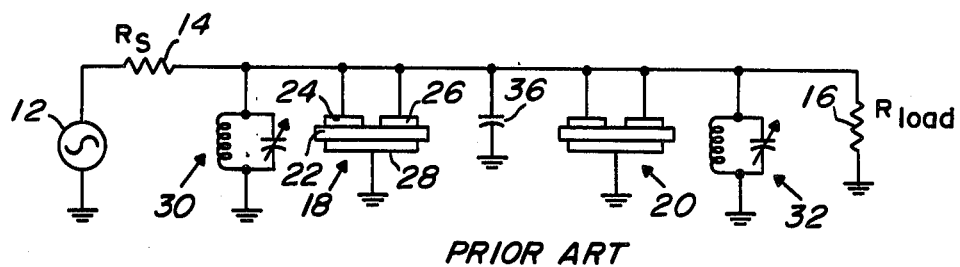
*Fig. 1*
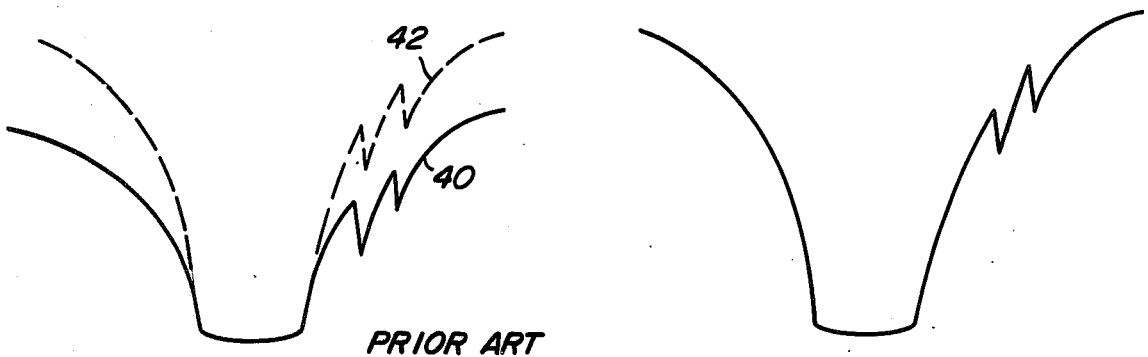
*Fig. 2*  *Fig. 4*
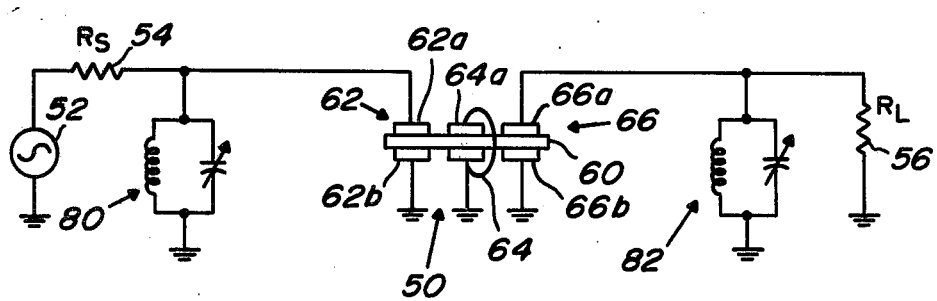
*Fig. 3*
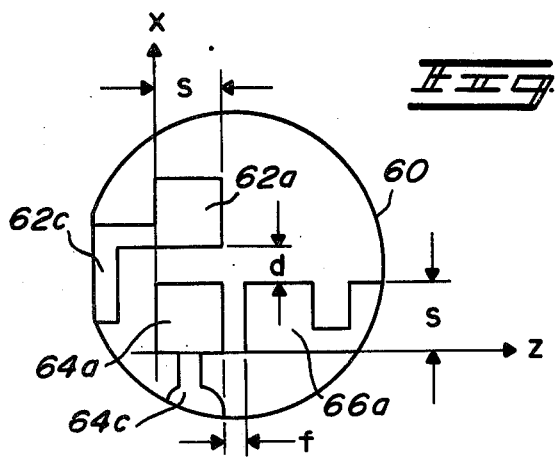
*Fig. 5A*
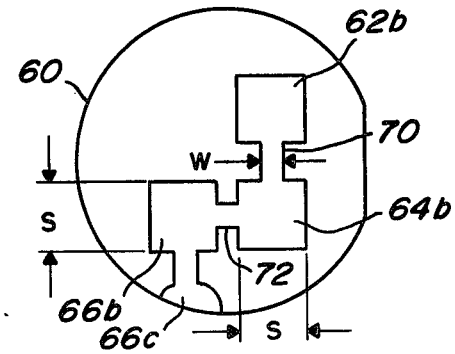
*Fig. 5B*

MULTIPOLE RESONATOR

BACKGROUND OF THE INVENTION

The present invention pertains to the signal processing art and in particular, to a multipole resonator adapted for application as a bandpass filter.

Multipole resonators for use in bandpass filter applications are well known, especially in the communication art. There, for example, radio frequency receivers employ intermediate frequency filters which selectively pass signals within a given bandwidth, providing significant attenuation to signals outside the given band. The characteristics of an ideal bandpass filter are a relatively linear passband response and infinite rejection to signals outside the passband. This ideal is only approximated, with most bandpass filters having some ripple in the bassband, and displaying less than ideal attenuation characteristics outside of the band.

Piezoelectric elements, particularly quartz crystals, find extended use in multipole bandpass filters. FIG. 1 illustrates a typical dual coupled four pole monolithic crystal filter in circuit configuration with a signal generator 12, having a source impedance 14, and a filter load impedance 16. The filter includes two dual coupled monolithic crystals filters 18 and 20. Since the configuration and electrical characteristics of the second two pole crystal element 20 are identical to that of the first element 18, only the element 18 will be described in detail. The two pole element 18 is comprised of a central piezoelectric element 22, preferably quartz, which has deposited thereon predeterminedly positioned electrodes 24, 26 and the ground electrode 28. Input signals are applied at the input pair of electrodes, 24 and 28 and are thereafter acoustically coupled through the quartz element 22 whereby they may be extracted from the output electrodes 26 and 28. A tank circuit 30 is shown in shunt with the input electrodes 24, 28, for tuning out the input capacitance Co of the input reasonator 24, 28. A similar tank circuit 32 is shown coupled across the output of the second crystal element 20, for providing the same tuning purpose as the first tank circuit 30. A capacitor 36 is in shunt between the two filter elements 18, 20, supplying an appropriate coupling between elements 18 and 20.

FIG. 2 illustrates by a solid line 40 the frequency response plot of a single dual coupled resonator, such as resonator 18. As FIG. 2 illustrates, the single resonator has a relatively flat passband characteristic and steep side skirts, but displays spurs outside of the passband which significantly degrade filter performance. When the two, two pole crystal filters 18 and 20 are cascaded, thus forming a four pole filter, the response plot is as shown by the dotted line 42. By cascading the two filters, the results are essentially the algebraic summation of two response plots from a single two pole monolithic crystal filter. Thus, the effect is essentially to maintain the passband response but steepen the side skirts. Also, cascading more greatly attenuates the spurs relative to the passband. Notice, however, that due to the algebraic summation of the single response as shown at 40, the spurs in the cascaded response plot at 42 are essentially twice their original value. Thus, cascading two stages does not optimally reduce spur size.

Hence, the prior art has felt a need for an effective, yet inexpensive bandpass filter which exhibits a relatively flat passband, has steep side skirts, and provides optimum spur suppression.

SUMMARY OF THE INVENTION

It is an object of this invention, therefore, to provide a bandpass filter which displays a relatively flat passband characteristic as well as steep side skirts and reduced spurious response.

It is a further object of this invention to provide the above described bandpass filter which may be fabricated as a single monolithic crystal.

Briefly, according to the invention, the inventive multipole resonator includes a monolithic piezoelectric element having X, Y and Z axes and which displays anisotropic properties with respect to the X and Z axes thereof. First, second and third pairs of electrodes are formed on the piezoelectric element. Each pair of electrodes has predetermined dimensions and has each of its electrodes formed on opposite sides of the piezoelectric element. The first electrode pair is positioned on the piezoelectric element at a predetermined location along the X axis thereof. The second electrode pair is positioned on the piezoelectric element along the X axis thereof at a predetermined distance from the first electrode pair. The second electrode pair is also positioned along the Z axis of the piezoelectric element. The third electrode pair is positioned on the piezoelectric element along the Z axis thereof at a predetermined distance from the second electrode pair.

The multipole resonator is adapted for circuit configuration whereby an input signal to be processed is applied at the first electrode pair, and is extracted from the third electrode pair, with the electrodes of the second electrode pair being shorted together. The attenuation response of the multipole resonator has a transfer characteristic which is essentially flat in the passband, but which displays sharp skirt attenuation, as well as significantly suppressing spurious responses.

BRIEF DESCRIPTION OF THE DRAWINGS

FIG. 1 illustrates, in schematic diagram form, a conventional prior art four pole crystal filter;

FIG. 2 illustrates the transfer characteristics of the prior art filter shown in FIG. 1;

FIG. 3 illustrates in schematic diagram form the inventive multipole resonator in circuit configuration with a signal source and a load impedance;

FIG. 4 is a frequency response plot of the inventive filter shown in FIG. 3; and FIGS. 5A and 5B illustrate the preferred construction of a three pole monolithic crystal resonator.

DETAILED DESCRIPTION OF THE PREFERRED EMBODIMENT OF THE INVENTION

FIG. 3 is a schematic diagram illustrating the inventive three pole crystal resonator 50 which is in circuit configuration with a signal source 52, having a source resistance 54, and a load resistance 56.

The three pole filter is comprised of a monolithic piezoelectric element 60 which is preferably comprised of an AT cut crystal. Formed on the piezoelectric element 60 are first, second and third electrode pairs 62, 64 and 66 respectively. Each electrode pair includes first and second electrodes 62a, 62b; 64a, 64b; and 66a and 66b, respectively, formed on opposite sides of the piezoelectric element 60.

FIGS. 5A and 5B illustrate fabrication of the three pole resonator 50 illustrated in FIG. 3. The monolithic quartz element 60 is defined by X, Y and Z axes with the X and Z axes as shown and the Y axis being perpendicular thereto, extending out of the figure. The piezoelectric element 60 used in the preferred embodiment of the invention is a quartz AT cut crystal which, as with other types of cut crystals displays anisotropic properties with respect to its X and Z axes.

FIG. 5A is a top view of the piezoelectric element 60 showing placement of the first electrodes 62a, 64a and 66a of the three electrode pairs 62, 64 and 66, respectively. Each electrode is a square metal pad, having a side dimension s. The first electrode 62a is formed, or aligned along the X axis of the piezoelectric element 60. The second electrode 64a is formed along the X axis of the piezoelectric element 60 and is at a predetermined spacing d from the first electrode 62a. The second electrode 64a is also formed along the Z axis of the piezoelectric element 60, as is the third electrode 66a, which is separated from the second electrode 64a by a predetermined distance f.

FIG. 5B illustrates the bottom view of the piezoelectric element 60 showing the second electrodes 62b, 64b and 66b of the first, second and third electrode pairs 62, 64 and 66, respectively. Each of the second electrodes 62b, 64b and 66b is formed directly on the opposite side of the piezoelectric element 60 as are their pair counterparts 62a, 64a and 66a, with the same square side dimension s. Selected electrodes 62a, 64a, 66a and 66b are provided with solder tabs 62c, 64c, 66c and 66c', respectively. Shown interconnecting the three second electrodes 62b, 64b and 66b are metal runs 70, 72 each of which has a width dimension w. In fabricating a multipole resonator as shown in FIGS. 5A and 5B, the designor selects the appropriate resonant frequency of the raw piezoelectric element 60 along with the dimensions s and spacings d, f as well as the width of the shorting strip w to synthesize the polynomials of the desired transfer characteristic, e.g. Butterworth, Chebyshev, Bessel and so forth.

In application, wires are soldered to each of the three top surface electrode tabs 62c, 64c and 66c as well as to one or more of the bottom side electrode tabs 66c' for connecting the multipole resonator within a circuit. In the alternative, the wires could connect to pins on a socket which is adapted to carry the resonator structure.

Referring again to FIG. 3, the input signal to be processed originating from the signal generator 52 is applied to the input pair of electrodes 62a and 62b of the first electrode pair 62. A tank circuit 80 performs in a similar manner to the tank circuit 30 of the prior art configuration shown in FIG. 1 to help tune out the input capacity of the resonator 50. The signal applied across the first electrode pair 62 excites the piezoelectric element 60 in the known manner, thus coupling energy to the second electrode pair 64, and hence to the third electrode pair 66. Referring again to FIG. 5A, a minimum amount of energy is transferred from the first electrode pair 62 to the third electrode pair 66 since the distance therebetween is great and the signal originating from one electrode pair decays exponentially as a function of distance.

The processed signal is taken from the third electrode pair 66 and passed to the load impedance 56. An output tank circuit 82 is provided to properly tune out the capacitance Co of the output electrodes 66.

A frequency response plot of the multipole filter 50 of FIG. 3 is illustrated in FIG. 4. Comparing this to the response plots 40 and 42 of FIG. 2, it is seen that both types of filters display substantially flat passband characteristics and steep skirts. It should be noted, however, that spurious responses of the improved filter are substantially suppressed as compared with the prior art structure. This results from the fact that the inventive resonator makes use of the anisotropic properties of the piezoelectric element. That is to say, by passing the signal to be processed both over the X and the Z axis of the piezoelectric element, the passband characteristic is maintained, whereas the spurious responses do not algebraically add as in the prior art response shown in FIG. 2, such that the spurs, or spurious response is not additive whereby it is substantially suppressed.

A sample of the inventive multipole resonator has been designed for operation at 10.7 megahertz. The 3db bandwidth was designed to be 10 kilohertz, with a passband ripple of about 0.7 dB. The diameter of the AT cut crystal was chosen as 0.400" (10.16mm) having a resonant frequency of 10.9 megahertz before plating on the electrodes.

The dimension of the electrodes, and their interspacing is as follows:

$s = 0.090''$ (2.286mm)
$d = 0.0048''$ (0.122mm)
$f = 0.028''$ (0.711mm) and
$w = 0.030''$ (0.762mm).

In summary, a multipole resonator has been described in detail which exhibits excellent passband and spurious response suppression characteristics. In addition, since the entire resonator may be constructed on a single piezoelectric element it is simple, and inexpensive to manufacture.

While a preferred embodiment of the invention has been described in detail, it should be apparent that many modifications and variations thereto are possible, all of which fall within the true spirit and scope of the invention.

For example, while a three pole filter has been described in detail, it should be understood that the invention may be practiced by fabricating a resonator having a greater number of poles.

We claim:

1. A multiple resonator adapted to process a signal comprising:

a monolithic piezoelectric element having X, Y and Z axes, said element exhibiting predetermined anisotropic properties with respect to said X and Z axes;

first, second and third pairs of electrodes formed on said piezoelectric element, each pair being of predetermined dimensions and having its electrodes formed on opposite sides of said piezoelectric element;

said first electrode pair being positioned on the piezoelectric element at a predetermined location along the X axis thereof;

said second electrode pair being positioned on the piezoelectric element along the X axis thereof at a predetermined distance from said first electrode pair, said second electrode pair also being positioned along the Z axis of the piezoelectric element;

means for shorting together the electrodes of said second electrode pair;

said third electrode pair being positioned on the piezoelectric element along the Z axis thereof at a predetermined distance from said second electrode pair;

means for applying said signal to one of said first and third electrode pairs such that the signal is coupled through said second electrode pair to the other of said first and third electrode pairs, respectively, for extraction thereat, whereby the transfer characteristic of said resonator is affected by the anisotropic property of the piezoelectric element.

2. The multipole resonator of claim 1 further comprising means for shorting together all electrodes which are formed on one side of the piezoelectric element.

3. The method of constructing a multipole resonator adapted for receiving and processing a signal, which resonator displays enhanced spur suppression comprising the steps of:

(a) producing a monolithic piezoelectric element which has X, Y, Z axes and which exhibits predetermined anisotropic properties with respect to said X and Z axes;

(b) forming a first electrode pair on said piezoelectric element in alignment with the X axis thereof, each of said first electrodes having predetermined dimensions and being located on opposite sides of said element;

(c) forming a second electrode pair on said piezoelectric element in alignment with the X axis thereof and at a predetermined distance from said first electrode pair, each of said second electrodes having predetermined dimensions and being located on opposite sides of said piezoelectric element, said second electrode pair also being aligned along the Z axis of said piezoelectric element;

(d) forming a third electrode pair on said piezoelectric element in alignment with the Z axis thereof and at a predetermined distance from said second electrode pair, each of said third electrodes having predetermined dimensions and being located on opposite sides of said piezoelectric element;

(e) providing a means for coupling said signal to one of said first and third electrode pairs;

(f) providing a means to extract said signal from the other of said first and third electrode pairs; and (g) providing a means for shorting together the electrodes of said second electrode pair such that the signal is coupled from one of said X and Z axes to the other through said second electrode pair.

4. The method of claim 3 further comprising the step of providing a means to short together all electrodes on one side of said piezoelectric element.

* * * * *